United States Patent
Chevalier

(10) Patent No.: US 8,704,502 B2
(45) Date of Patent: Apr. 22, 2014

(54) SWITCHING MODE POWER SUPPLY COMPRISING ASYNCHRONOUS LIMITER CIRCUIT

(75) Inventor: Laurent Chevalier, Sassenage (FR)

(73) Assignee: ST-Ericsson SA, Plan-les-Ouates (CH)

( * ) Notice: Subject to any disclaimer, the term of this patent is extended or adjusted under 35 U.S.C. 154(b) by 0 days.

(21) Appl. No.: 13/512,430

(22) PCT Filed: Nov. 22, 2010

(86) PCT No.: PCT/EP2010/067940
§ 371 (c)(1),
(2), (4) Date: May 29, 2012

(87) PCT Pub. No.: WO2011/064169
PCT Pub. Date: Jun. 3, 2011

(65) Prior Publication Data
US 2012/0235654 A1    Sep. 20, 2012

(30) Foreign Application Priority Data

Nov. 25, 2009  (FR) ...................................... 09 58375

(51) Int. Cl.
*G05F 1/40*     (2006.01)

(52) U.S. Cl.
USPC .......................................................... 323/282

(58) Field of Classification Search
USPC ............................ 323/265, 271, 282, 283, 351
See application file for complete search history.

(56) References Cited

U.S. PATENT DOCUMENTS

| | | | |
|---|---|---|---|
| 4,754,388 A * | 6/1988 | Pospisil | 363/54 |
| 4,891,728 A * | 1/1990 | Preis et al. | 361/18 |
| 5,404,095 A * | 4/1995 | Lammers | 323/290 |
| 5,686,751 A | 11/1997 | Wu | |
| 6,198,257 B1 * | 3/2001 | Belehradek et al. | 323/222 |
| 7,565,559 B2 * | 7/2009 | Chapuis | 713/300 |
| 7,710,092 B2 * | 5/2010 | Chapuis et al. | 323/282 |
| 8,040,117 B2 * | 10/2011 | Telefus | 323/271 |
| 8,085,024 B2 * | 12/2011 | Prodic et al. | 323/283 |
| 8,269,475 B2 * | 9/2012 | Hester et al. | 323/288 |

OTHER PUBLICATIONS

International Search Report issued in corresponding International application No. PCT/EP2010/067940, mailing date Feb. 18, 2011.
Written Opinion of the International Searching Authority issued in the corresponding International application No. PCT/EP2010/067940, mailing date Feb. 18, 2011.
Rocha, Jose, et al., "Limiting Internal Supply Voltage Spikes in DC-DC Converters", ISIE 2009, IEEE, Piscataway, NJ, USA, Jul. 5, 2009, pp. 1060-1065, XP031519129, ISBN: 978-1-4244-4347-5.
Jeesung, Jung, et al., "Improved Breakdown-Voltage Complementary MOSFET in a 0.18μm Standard CMOS Process for Switch Mode Power Supply (SMPS) Applications", ISPSD 2009, Barcelona, Spain, IEEE, Piscataway, NJ, USA, Jun. 14, 2009, pp. 239-242, XP031485183, ISBN: 978-1-4244-3525-8.

* cited by examiner

*Primary Examiner* — Adolf Berhane
(74) *Attorney, Agent, or Firm* — Patent Portfolio Builders, PLLC

(57) ABSTRACT

The invention relates to a switching mode power supply device comprising at least one MOS power transistor made on an integrated circuit and operating in switching mode, the drain and the source of said at least one MOS power transistor being connected, via connecting members having a non-null inductance, to one or several external circuits to said integrated circuit. According to the invention, the device further comprises a limiter circuit able to limit the current variations in at least one of said connecting members during the switching of said MOS power transistor. This limiter circuit enables to maintain the drain-source voltage of the MOS power transistor below a predetermined threshold value when it commutes.

8 Claims, 7 Drawing Sheets

SWITCHING MODE POWER SUPPLY COMPRISING ASYNCHRONOUS LIMITER CIRCUIT

The present invention relates to switching mode power supply devices wherein at least a portion of the control circuit of which is embodied on an integrated circuit.

Integrated circuits are usually in the form of rectangular casings equipped on one or several sides or on one of their surfaces, with pins which make it possible to establish electrical connections with a circuit that is external to the casing, for example a power source or a load circuit. The casing encloses a silicon chip comprising integrated components such as for example transistors or diodes. These integrated components are connected to their external environment via an assembly of connections, such as metallic tracks or connecting wires of all kinds.

In what follows, the term "connecting member" is used to designate the assembly of connections that ensure the electric connection between an input and/or output of an integrated component of the chip and a circuit or component external to the casing. This connecting member comprises the connection between the input and/or output of the integrated component and the corresponding connecting pad on the silicon chip, the connection between the connecting pad and the corresponding pin of the casing and the connection between the casing pin and the circuit or external component.

A connecting member may be modelized as an inductance $L_p$ mounted in series with a resistance $R_p$ as shown in FIG. 1. The inductance value L is of the order of a few nanohenries (nH) and the resistance value R is of around a hundred milliohms (mΩ). The connecting member thus serves as a direct current source when the voltage at its terminals varies.

Within the framework of switching mode power supplies having a control circuit embodied by an integrated circuit, the presence of such connecting members creates overvoltages at the drain-source voltage and the gate-source voltage of the MOS transistors of the supply control circuit, thus leading to weakening these transistors and rendering them less reliable.

This issue will be shown hereafter in the framework of a DC/DC buck-type switching mode power supply the electric diagram of which is represented on FIG. 2.

This switching mode power supply comprises a p-channel MOS power transistor, referenced P1, series-mounted with an n-channel MOS power transistor, referenced N1, between a positive supply terminal VDD and a negative supply terminal GND of an external supply circuit. Power transistors P1 and N1 are made on the silicon chip of an integrated circuit CI. They are connected to the terminals VDD and GND via connecting members modeled as a parasitic inductance in series with a parasitic resistance. More particularly, the source of the transistor P1 is connected to the terminal VDD via a connecting member CN1 and the source of transistor N1 is connected to the terminal GND via a connecting member CN2. The drains of transistors P1 and N1, connected together, are connected to a first end of an external inductance L via a connecting member CN3, the other end of the inductance L being connected to an external load circuit comprising a load resistance $R_L$ parallel-mounted with a load capacitor $C_L$.

When in operation, transistors P1 and N1 operate in switching mode to generate a voltage VS at the load circuit terminals, which voltage VS is lower than voltage VDD. Transistors P1 and N1 are controlled by substantially identical control signals. It is worth noting that however, in order to prevent a short-circuit current between VDD and GND at the instant the transistor starts conducting N1 (switching to the on-state), the opening of the transistor P1 (switching to the off-state) is slightly controlled before the closing of transistor N1 (switching to the on-state).

As can be seen on FIG. 2, the power transistors P1 and N1 have their source and drain connected to connecting members. These connecting members create overvoltages at transistors P1 and N1 when they are switching, as illustrated in FIGS. 3 and 4.

FIG. 3 shows two curves:
a first curve represents the voltage, referenced $VS_{p1}$, on the source of transistor P1, and
a second curve represents the voltage, referenced $VS_{N1}$, on the source of transistor N1.

FIG. 4 shows a curve representing the voltage, referenced $VD_{p1}$, on the drain of the transistor P1 and transistor N1.

As can be seen on these figures, voltage instabilities $VS_{P1}$, $VS_{N1}$ and $VD_{P1}$ appear during the switching of transistors P1 and N1. These instabilities are particularly due to parasitic inductances and resistances of the connecting members which serve as sources of direct current at the instant the transistors N1 and P1 switch. These instabilities thus create overvoltages between the drain and the source of transistors P1 and N1, leading to their weakening. As illustrated in FIGS. 3 and 4, these overvoltages can reach 9 volts for transistor P1 during its switching from the on-state to off-state.

There are solutions consisting in increasing the transition time of the power transistor P1, to reduce these over-voltages.

One of these solutions consists in decreasing the size of the control inverters (also called control buffers) of the power transistors P1 and N1 such as to obtain longer transition times. This solution is nevertheless not really adapted for most current switching mode arrangements which use a high switching frequency. It also penalizes the transitional behavior of the device and the power Supply Rejection Ratio (PSRR).

Another solution consists in replacing each power transistor P1 and N1 by a plurality of parallel-mounted power transistors, for example a small transistor, an average transistor and a transistor of larger size, and to switch them one after the other by starting by the smallest transistor and ending by the largest one, such as to gradually make the current crossing the parasitic inductance of the connecting members vary.

In these two cases, the transition times must be extended significantly to have any effect on the over-voltages.

SUMMARY OF THE INVENTION

An object of the present invention is to propose another solution without the aforementioned drawbacks.

According to the invention, a reduction in the current variation of the connecting members is proposed, when the device power transistors switch in order to maintain the drain-source voltage of the power transistors below a predetermined threshold value when they switch.

To this end, the object of the invention is a switching mode power supply device, such as a buck-type DC-DC voltage converter or a charge pump, comprising at least one MOS power transistor made on an integrated circuit and operating in switching mode, the drain and the source of said MOS power transistor being connected, via connecting members having a non-null inductance, to one or several external circuits to said integrated circuit, characterized in that it further comprises a limiter circuit able to limit the current variations in at least one of said connecting members during the switching of said MOS power transistor.

According to a specific embodiment, the limiter circuit is mounted between the drain and the source of the MOS power transistor.

Advantageously, the limiter circuit is only active during the switching of the power transistor.

According to a specific embodiment, the power transistor is a p-channel transistor and the limiter circuit comprises:
- a resistance series mounted with a capacitor between the source and the drain of the power transistor, the source of the power transistor being connected to a first terminal of the resistance and the drain of the power transistor being connected to a first terminal of the capacitor,
- at least one p-channel MOS transistor having its gate connected to an intermediate point between said resistance and said capacitor, its drain connected to the drain of the MOS power transistor and its source connected to the source of the MOS power transistor.

In this embodiment, this limiter circuit advantageously further comprises a second p-channel MOS transistor mounted between the drain of said first transistor and the drain of the power transistor, the source of said second transistor being connected to the drain of the first transistor and the drain and gate of said second transistor being connected to the drain of the MOS power transistor.

According to another specific embodiment, the power transistor is an n-channel transistor and the limiter circuit comprises:
- a resistance mounted in series with a capacitor between the source and drain of the power transistor, the source of the power transistor being connected to a first terminal of the resistance and the drain of the power transistor being connected to a first terminal of the capacitor,
- at least one first n-channel MOS transistor having its gate connected to an intermediate point between said resistance and said capacitor, its drain connected to the drain of the MOS power transistor and its source connected to the source of the MOS power transistor.

In this embodiment, the limiter circuit advantageously further comprises a second n-channel MOS transistor mounted between the drain of the first transistor and the drain of the power transistor, the source of said second transistor being connected to the drain of the first transistor and the drain and the gate of said second transistor being connected to the drain of the MOS power transistor.

The present invention also relates to a portable equipment comprising a switching mode power supply device such as defined previously.

BRIEF DESCRIPTION OF THE DRAWINGS

The invention will be better understood and other objects, details, characteristics and advantages will become more apparent in the following detailed explanatory description, with reference above to the accompanying drawings, which represent.

The invention is described for two types of switching mode power supplies: a buck-type DC/DC voltage converter and a negative charge pump circuit. Of course it can be applied to other types of switching mode power supplies comprising at least one power transistor operating in switching mode and having its drain and its source connected to connecting members comprising a non-null parasitic inductance.

Buck-Type Continuous Voltage Converter

Figure 1:
FIG. 1, already described, the modelization diagram of a connecting member.
Figure 2:
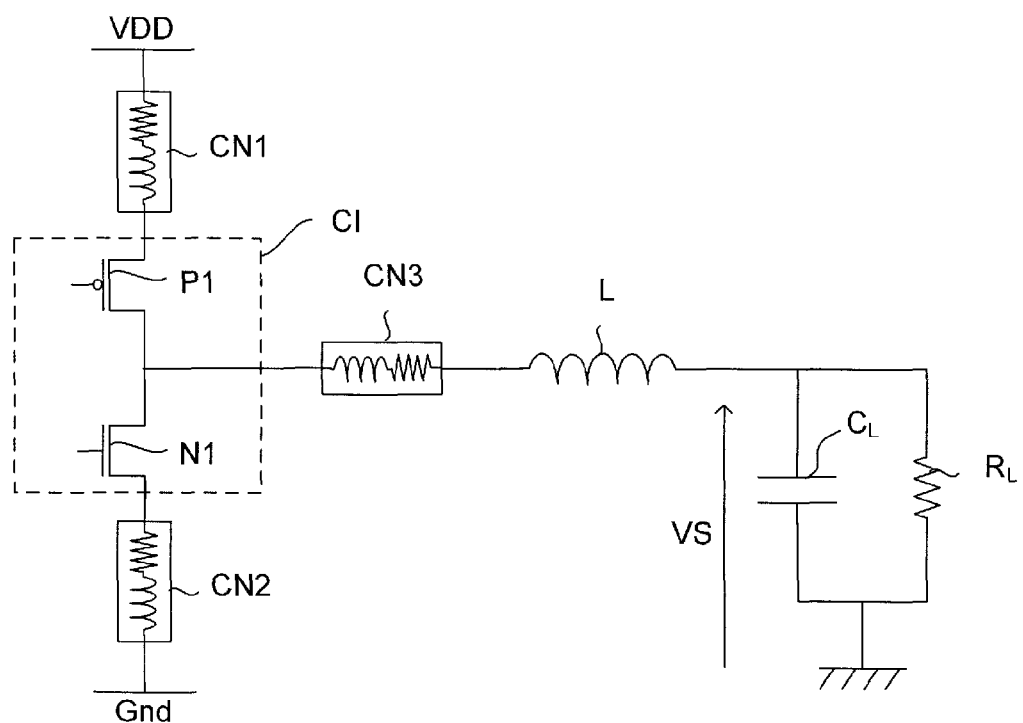
FIG. 2, already described, the electric diagram of a buck-type DC/DC switching mode power supply of the prior art.
Figure 4:
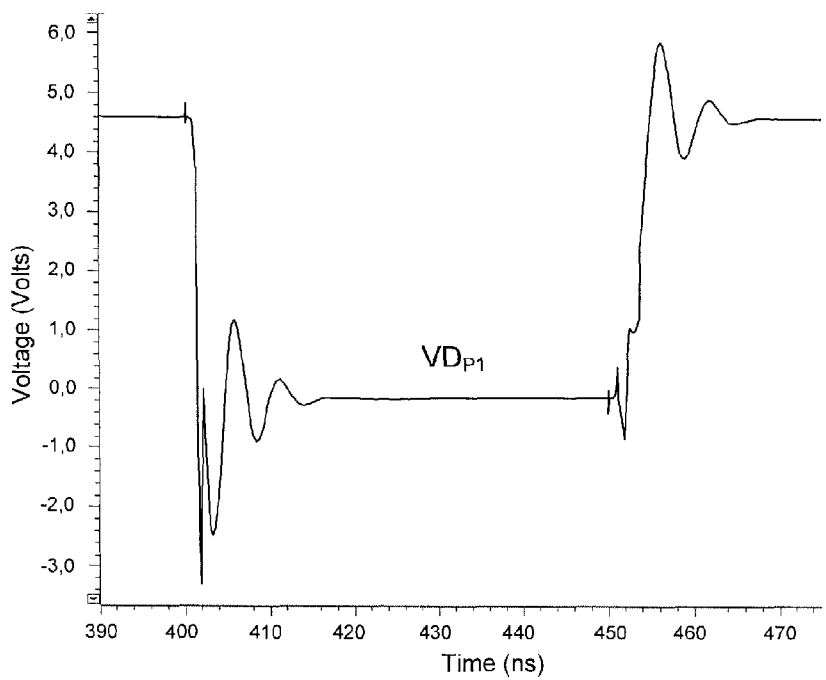

FIG. 4 represents the electric diagram of a buck-type DC/DC voltage converter in accordance with the invention. With respect to the converter illustrated in FIG. 2, it further comprises a limiter circuit able to limit the current variations in the connecting members CN1, CN2 and CN3 during the switching of transistors P1 and N1. This circuit is mounted between the drain and the source of the transistor P1 and enables to maintain the drain-source voltage of transistor P1 below a threshold value during the switching of transistors P1 and N1.

This limiter circuit comprises two p-channel MOS transistors, referenced P2 and P3, mounted in series between the source and the drain of transistor P1. The source and the drain of the transistor P2 are connected respectively to the source of transistor P1 and to the source of transistor P3. The drain and gate of transistor P3 are connected to the drain of transistor P1. A resistance R1 is series-mounted with a capacitor C1 between the source and the drain of transistor P1. The resistance R1 is mounted between the source and the gate of transistor P2 and the capacitor C1 is mounted between the gate of transistor P2 and the drain of transistor P3.

Figure 6:
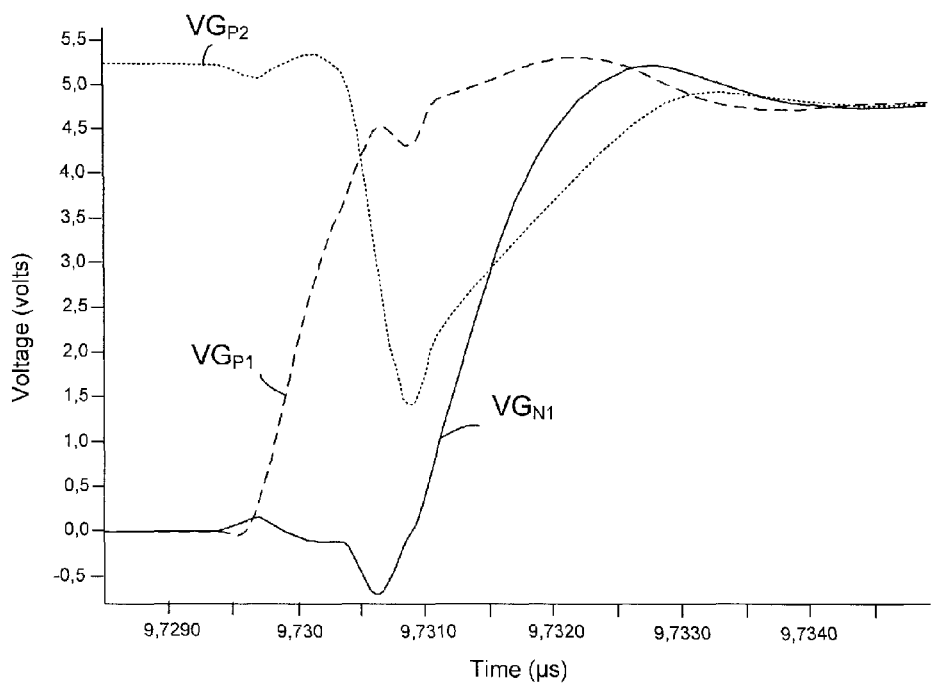
FIG. 6, curves representing the gate voltages of the transistors of the switching mode power supply of FIG. 5.
Figure 7:
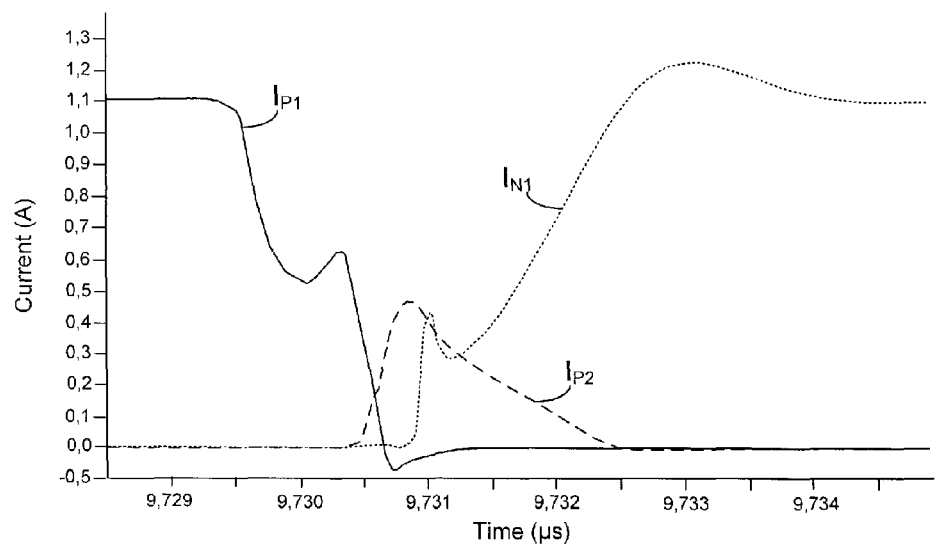
FIG. 7, curves representing the currents circulating through the transistors of the switching mode power supply of FIG. 5.
Figure 8:
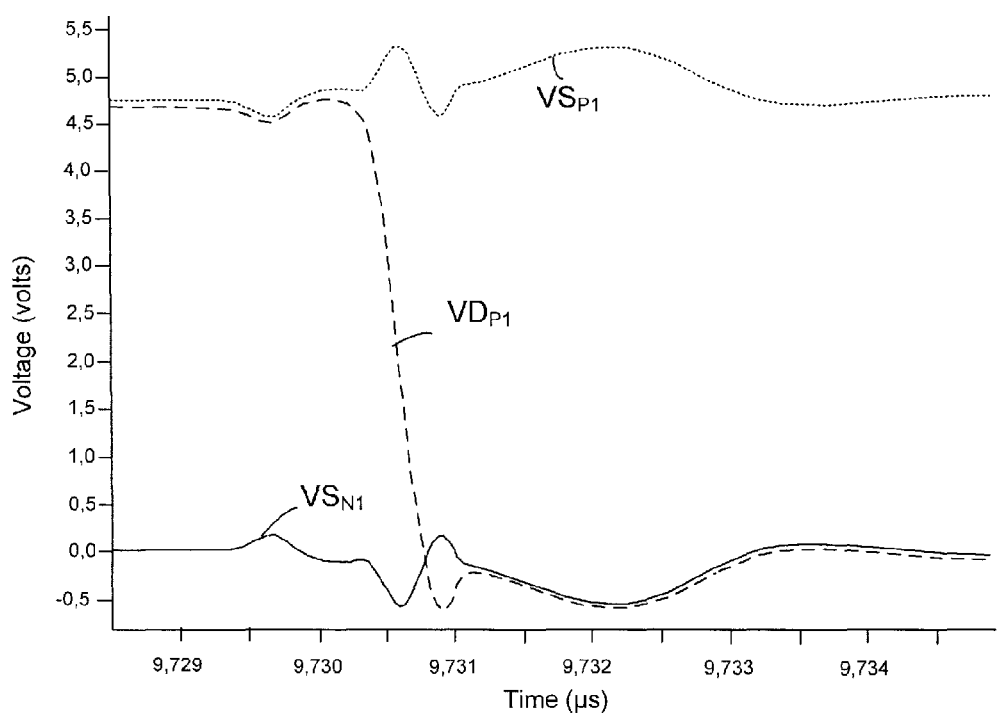
FIG. 8, to compare with FIGS. 3 and 4, curves representing the voltages of the drain and source of the transistors of the switching mode power supply of FIG. 5.

The operating of the converter is illustrated by FIGS. 6, 7 and 8.

FIG. 6 shows
the voltage, referenced $VG_{P1}$, of the gate of the transistor P1,
the voltage, referenced $VG_{N1}$, of the gate of transistor N1, and
the voltage, referenced $VG_{P2}$, of the gate of transistor P2.

FIG. 7 shows the currents, referenced $I_{P1}$, $I_{N1}$ and $I_{P2}$, flowing respectively through transistors P1, N1 and P2.

Figure 3:
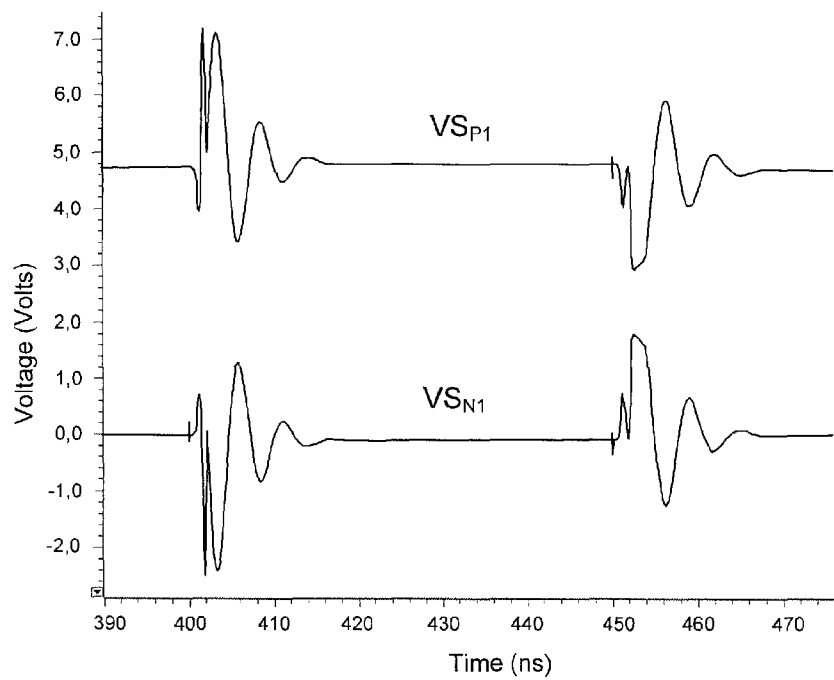
FIGS. 3 and 4, already described, curves representing the voltages of the drain and source of the power transistors of the switching mode power supply of FIG. 2.
Figure 5:
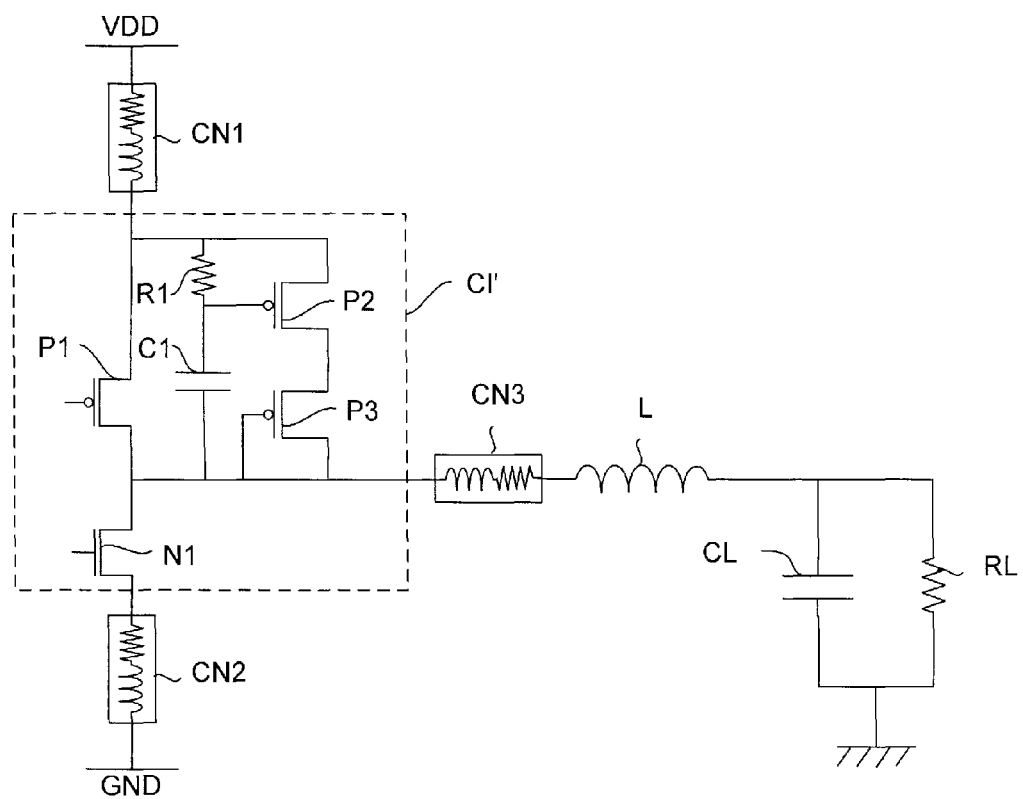
FIG. 5, the electric diagram of a buck-type switching mode power supply in accordance with the invention.

FIG. 8, to be compared to FIGS. 3 and 4, represents the voltages $VS_{P1}$, $VS_{N1}$ and $VD_{P1}$, in the circuit of FIG. 5.

With reference to FIGS. 6 and 7, transistor P1 is switched before the transistor N1 in order to prevent a short-circuit current between VDD and GND at the instant the transistor N1 starts conducting. As transistor P1 gradually opens (gate voltage $VG_{p1}$ increases), the gate voltage $VG_{p2}$ of transistor P2 decreases. The latter provides the current $I_{p2}$ to inductance L and to the load circuit during the switching of transistors P1 and N1. The presence of such a current makes it possible to prevent the discontinuities or the too rapid variations of current flowing through the connecting members CN1, CN2 and CN3 of the circuit, thus, leading to limiting the overvoltages at the drain source voltage of power transistors P1 and N1.

As illustrated in FIG. 8, this circuit arrangement enables to maintain the drain source voltage of transistors P1 and N1 below 6 volts.

The reaction time of the limiter circuit can be adjusted by acting on the values of resistance R1 and capacitor C1. The higher the capacitance of capacitor C1, the earlier the transistor P1 switches to the on-state in order to supply current to the inductance L and to the load circuit. The higher the resistance value R1, the longer the transistor P2 continues to supply current to the inductance L and to the load circuit.

Moreover given that the overvoltages take place when the limiter circuit supplies the maximum of current, the latter advantageously comprises two series-mounted MOS transistors as in the present case, in order to spread over these two transistors the drain-source voltage of transistor P1 and to increase the robustness of the limiter circuit.

Negative Charge Pump

Figure 9:
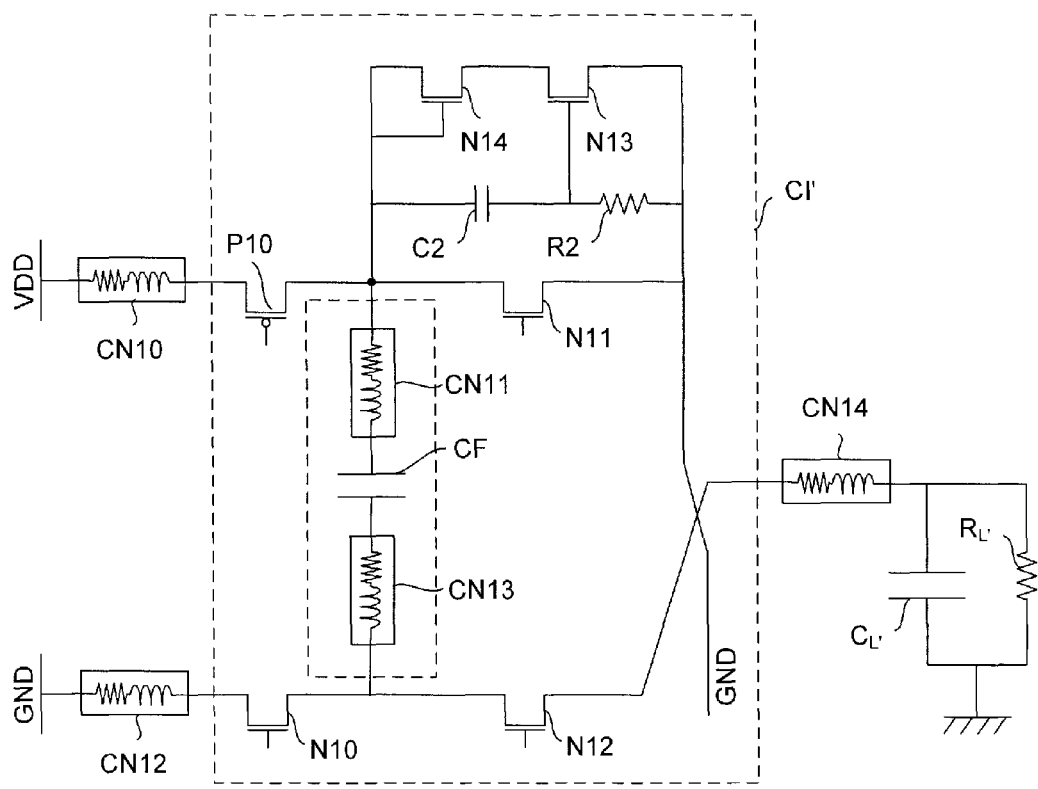
FIG. 9, the electric diagram of a negative charge pump in accordance with the invention.

FIG. 9 represents the electric diagram of a negative charge pump in accordance with the invention. In this example, the charge pump comprises a first stage for charging a capacitor CF with a first charge voltage Vdd and a second stage for, after disconnection of the first stage, providing the inverse voltage −Vdd to a load circuit. Both stages are constituted of MOS power transistors made on an integrated circuit CI'. The capacitor CF and the load circuit are external to the integrated circuit CI'.

The transistors of the integrated circuit are connected, via connecting members, to external supply terminals VDD and GND, able to provide the charge voltage vdd.

The first stage comprises a p-channel MOS power transistor, referenced P10, having its source connected to the supply terminal VDD via a connecting member CN10 and its drain connected to a first terminal of the external capacitor CF via a connecting member CN11. The first stage also comprises an n-channel MOS power transistor, referenced N10, having its source connected to the supply terminal GND via a connecting member CN12 and its drain connected to a second terminal of the external capacitor CF via a connecting member CN13.

The second stage comprises an n-channel MOS power transistor, referenced N11, having its drain connected to the drain of the transistor P10 and its source connected to the supply terminal GND via the connecting member CN12 or another connecting member. The second stage also comprises an n-channel MOS power transistor, referenced N12, having its drain connected to the drain of the transistor N10 and its source connected to the external load circuit via a connecting member CN14. The load circuit is modeled by a storage capacitor $C_{L'}$ mounted parallel to a load resistance $R_{L'}$.

As for the buck-type converter, the presence of a parasitic inductance in the connecting members creates overvoltages between the drain and the source of the power transistors of the integrated circuit, particularly between the drain and the source of transistor N11.

According to the invention, this charge pump is completed by a limiter circuit able to limit the current variations within the connecting members when the transistor N11 switches. This limiter circuit is mounted between the drain and the source of transistor N11 and enables to maintain the drain-source voltage of the transistor N11 below a threshold value when it changes states.

This limiter circuit comprises two n-channel MOS transistors N13 and N14, mounted in series between the source and the drain of the transistor N11. The source and the drain of transistor N13 are connected respectively to the source of transistor N11 and to the source of the transistor N14. The drain and gate of transistor N14 are connected to the drain of transistor N11. A resistance R2 is mounted in series with a capacitor C2 between the source and the drain of transistor N11. The resistance R2 is mounted between the source and the gate of transistor N13 and the capacitor C2 is mounted between the gate of transistor N13 and the drain of transistor N14.

Figure 10:
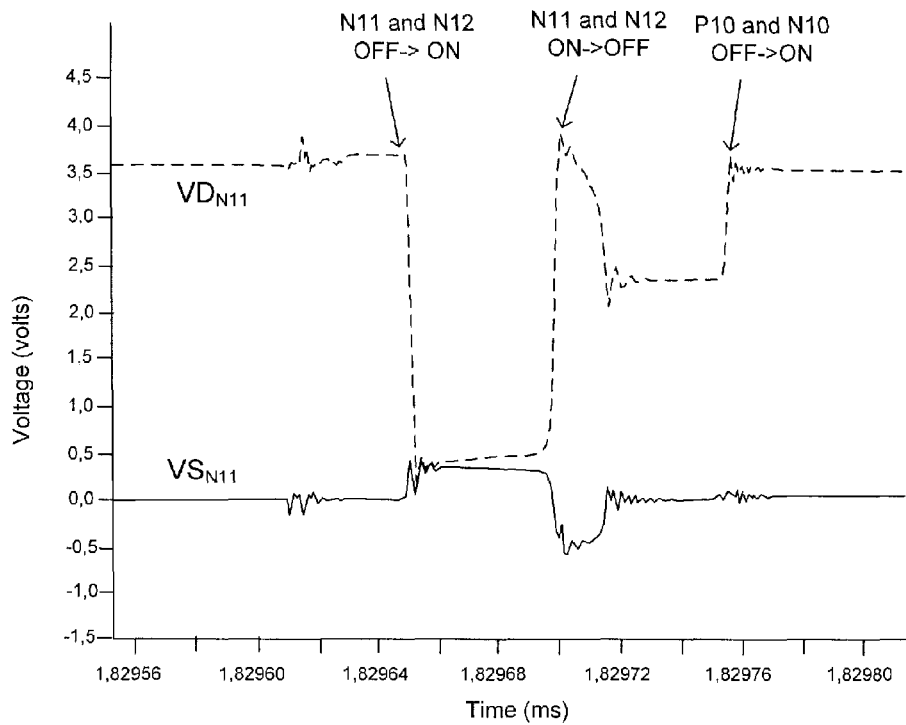
FIG. 10, curves representing the voltage of the drain and the voltage of the gate of a power transistor of the charge pump of FIG. 9.
Figure 11:
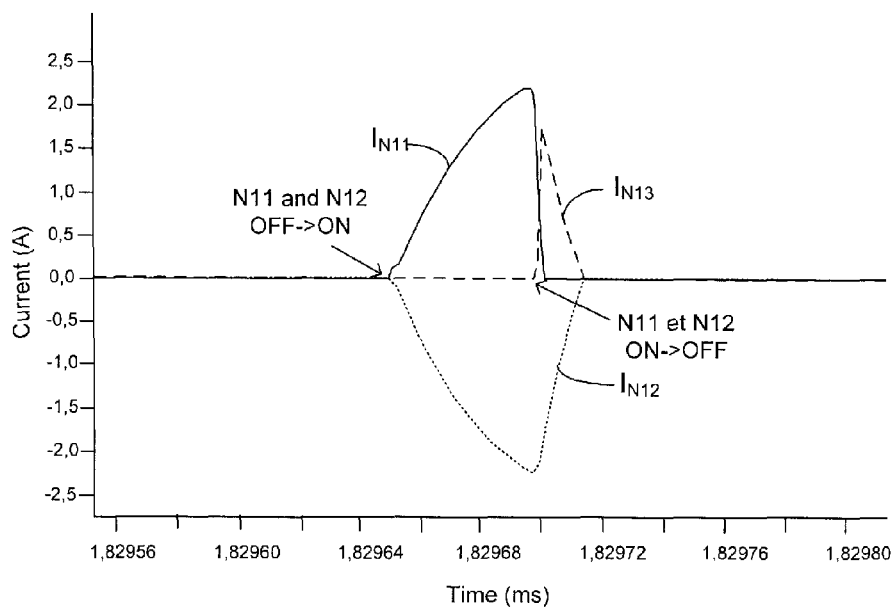
FIG. 11, curves representing the currents circulating through transistors of the charge pump of FIG. 9.

The behavior of the voltage at the terminals of the transistor N11 is illustrated by FIGS. 10 and 11. FIG. 10 represents the voltage, referenced $VD_{N11}$, on the drain of the transistor N11 and the voltage, referenced $VS_{N11}$, on the source of the transistor N11. FIG. 11 represents the currents, referenced $I_{N11}$, $I_{N12}$ and $I_{N13}$, flowing respectively through the transistors N11, N12 and N13.

As can be seen from these figs., the limiter circuit enables to limit the overvoltages between the drain and the source of the power transistor N11 at the instant it stops conducting (switching to the off-state) of the transistors N11 and N12. The current $I_{N13}$ pass through the transistors N13 and N14. The result is that the current variations in the connecting members CN11 and CN12 are reduced during this phase.

It is worth noting that, in these two embodiments, the limiter circuit is completely asynchronous with respect to the rest of the control circuit of the switching mode power supply and is triggered autonomously. Furthermore, it is only triggered off during switching of the power transistors. Thus, it is only active during these switching phases. In addition, when it is active, there is no current loss as the current crossing it is supplied to the load circuit.

Such a limiter circuit may be set-up in all types of switching mode power supplies comprising power transistors operating in switching mode and is advantageously mounted between the drain and the source of the power transistor undergoing the strongest overvoltages during switching. If the switching mode power supply comprises several power transistors undergoing strong overvoltages, it is possible to provide a limiter circuit for each one of them.

The invention claimed is:

1. A switching mode power supply device comprising at least one MOS power transistor made on an integrated circuit and operating in switching mode, the drain and the source of said at least one MOS power transistor being connected together, via connecting members having a non-null inductance, to one or several external circuits to said integrated circuit, characterized in that it further comprises a limiter circuit able to limit the current variations in at least one of said connecting members during the switching of said MOS power transistor, said limiter circuit comprising:
    a resistance mounted in series with a capacitor between the source and the drain of the power transistor, the source of the power transistor being connected to a first terminal of the resistance and the drain of the power transistor being connected to a first terminal of the capacitor, and
    at least a first MOS transistor having its gate connected to an intermediate point between said resistance and said capacitor, its drain connected to the drain of the MOS power transistor and its source connected to the source of the MOS power transistor.

2. The device according to claim 1, wherein the limiter circuit is mounted between the drain and the source of said MOS power transistor.

3. The device according to claim 1, wherein said limiter circuit is only active during the switching of the power transistor.

4. The device according to claim 1, wherein the MOS power transistor and said first MOS transistor are p-channel transistors.

5. The device according to claim 4, wherein the limiter circuit further comprises a second n-channel MOS transistor mounted between the source of said first transistor and the source of the power transistor, the source of said second transistor being connected to the drain of the first transistor and the drain and gate of said second transistor being connected to the drain of the MOS power transistor.

6. The device according to claim 1, wherein the MOS power transistor and said first MOS transistor are n-channel transistors.

7. The device according to claim 6, wherein the limiter circuit further comprises a second MOS n-channel transistor mounted between the drain of said first transistor and the drain of the power transistor, the source of said second transistor being connected to the drain of the first transistor and the drain and gate of said second transistor being connected to the drain of the MOS power transistor.

8. A portable equipment comprising a switching mode power supply device according to claim 1.

* * * * *